US006552758B1

(12) United States Patent
Koyama

(10) Patent No.: US 6,552,758 B1
(45) Date of Patent: Apr. 22, 2003

(54) ACTIVE MATRIX CIRCUIT

(75) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/375,616

(22) Filed: Aug. 17, 1999

Related U.S. Application Data

(63) Continuation of application No. 08/834,331, filed on Apr. 15, 1997, now Pat. No. 5,952,989.

(30) Foreign Application Priority Data

Apr. 16, 1996 (JP) ........................................ 8-118288

(51) Int. Cl.[7] ..................... G02F 1/136; G02F 1/1343; H01L 31/036

(52) U.S. Cl. ......................... 349/43; 349/42; 349/139; 257/72

(58) Field of Search ............................ 349/42, 43, 46, 349/139, 140; 257/59, 72

(56) References Cited

U.S. PATENT DOCUMENTS 4,759,610 A * 7/1988 Yanagisawa ................ 349/162
4,870,396 A * 9/1989 Shields ........................ 345/92
4,920,409 A * 4/1990 Yamagishi .................. 348/791
5,012,228 A * 4/1991 Masuda et al. ............... 345/92
5,045,753 A 9/1991 Katayama et al.
5,414,547 A * 5/1995 Matsuo et al. ................ 349/44
5,506,598 A 4/1996 Shimada et al. .............. 345/92
5,528,396 A * 6/1996 Someya et al. ............... 349/43
5,724,107 A * 3/1998 Nishikawa et al. ........... 349/38
5,760,861 A * 6/1998 Kim ........................... 349/110
5,777,591 A * 7/1998 Katoh et al. .................. 345/92
5,952,989 A * 9/1999 Koyama ...................... 349/43

FOREIGN PATENT DOCUMENTS

| | | |
|---|---|---|
| EP | 0 552 952 | 7/1993 |
| JP | 02-254419 | 10/1990 |
| JP | 04-344613 | 12/1992 |
| JP | 05-196964 | 8/1993 |
| JP | 05-265045 | 10/1993 |
| JP | 06-043484 | 2/1994 |
| JP | 06-151461 | 5/1994 |
| JP | 07-064516 | 3/1995 |

* cited by examiner

*Primary Examiner*—James Dudek
*Assistant Examiner*—Dung Nguyen
(74) *Attorney, Agent, or Firm*—Fish & Richardson P.C.

(57) ABSTRACT

In an active matrix circuit, a series connection of a plurality of transistors as a switching element is provided for each pixel electrode. The transistors are controlled by different gate signal lines.

36 Claims, 10 Drawing Sheets

ACTIVE MATRIX CIRCUIT

This is a continuation of U.S. application Ser. No. 08/834,331, filed Apr. 15, 1997, now U.S. Pat. No. 5,952, 989.

BACKGROUND OF THE INVENTION

1. Field of the Invention

The present invention relates to an active matrix circuit which is used for display with a liquid crystal, and other purposes.

2. Description of the Related Art

FIG. 6 schematically shows an example of a conventional active matrix display device. In a display area which is enclosed by a broken line in FIG. 6, transistors Tr as switching elements are arranged in matrix form such that a single transistor is provided for each matrix element. When attention is paid to an nth-row/mth-column element of the matrix, an image (data) signal line $Y_m$ is connected to the source of the transistor Tr and a gate (selection) signal line $X_n$ is connected to the gate electrode of the transistor Tr.

Attention is now paid to the transistor as the switching element, which performs data switching and drives a liquid crystal cell LC. An auxiliary capacitor C, which supplements the capacitance of the liquid crystal cell LC, is used to hold image data. The transistor Tr switches image data, i.e., a voltage, to be applied to the liquid crystal. The most serious problem in using a transistor as s switching element is leak current (or off-current) that flows in a state that no selection pulse is applied to the gate (non-selection state). If the leak current is large, the amount of charge stored in the pixel electrode and the auxiliary capacitor easily decreases, resulting in deterioration in display performance.

SUMMARY OF THE INVENTION

An object of the invention is therefore to provide an active matrix circuit having small off-current.

According to the invention, a switching element is provided which is a series connection of a plurality of transistors. One end of the switching element is connected to a data signal line and the other end is connected to a pixel electrode. The respective transistors are controlled by independent gate signal lines. Connecting the transistors in series is effective in reducing the leak current.

More specifically, according to a first aspect of the invention, there is provided an active matrix circuit including first and second switching elements provided adjacent to each other and connected to the same data signal line and first to third gate (selection) signal lines that are adjacent to each other. The first switching element is controlled by the first and second gate signal lines while the second switching element is controlled by the second and third gate signal lines.

According to a second aspect of the invention, there is provided an active matrix circuit including first and second switching elements provided adjacent to each other and connected to the same data signal line and first to fourth gate (selection) signal lines that are adjacent to each other. The first switching element is controlled by the first and second gate signal lines while the second switching element is controlled by the third and fourth gate signal lines. The same signal is applied to the second and third selection signal lines.

FIGS. 1A and 1B are circuit diagrams showing the above-described first and second aspects of the invention, respectively. In these figures, a portion enclosed by a broken line corresponds to a pixel unit. In each of FIGS. 1A and 1B, each switching element consists of two transistors Tr1 and Tr2, which are controlled by different gate signal lines. In the case of FIG. 1B, two gate signal lines $X_n$ and $Z_n$ are provided for each row. However, as shown in FIG. 1B, the gate signal line $Z_n$ and a gate signal line $X_{n+1}$ of the next row are connected to each other outside the matrix, and therefore supplied with the same signal.

In each of the first and second aspects of the invention, an auxiliary capacitor C may be provided as in the conventional case of FIG. 6. However, although in the conventional case a capacitor can be formed between the pixel electrode and the gate signal line $X_{n+1}$ adjacent thereto as shown in FIG. 7, such a configuration is not preferable in the invention. This is because in the invention the gate signal line adjacent to the pixel electrode is the one for driving the pixel concerned, and therefore in the above configuration the potential of the pixel electrode would vary (called a through voltage drop) in accordance with on/off switching of a selection pulse.

Therefore, in the invention, it is preferred that an auxiliary capacitor be formed between the pixel electrode and a wiring line other than the gate signal line. For example, a capacitor may be provided such that a light-shielding layer is formed with a conductive material so as to overlap with the pixel electrode and is kept at a constant potential. Alternatively, as shown in FIG. 1C, a capacitor may be provided by forming an overlap between an intermediate portion of the transistors Tr1 and Tr2 and the gate signal line for controlling the transistor Tr2. In this case, it is not preferable to provide a capacitor between the intermediate portion and the gate signal line for controlling the transistor Tr1 for a reason described later. In FIG. 1C, an auxiliary capacitor C is provided in the circuit of FIG. 1A. An auxiliary capacitor may also be provided in the circuit of FIG. 1B in a similar manner.

As is derived from the above discussion, in the first aspect of the invention, pulses applied to the first and second gate signal lines overlap in time with each other and, similarly, pulses applied to the second and third gate signal lines overlap in time with each other. If pulses applied to the first and second gate signal lines did not overlap in time with each other, the transistors Tr1 and Tr2 could not be turned on at the same time and hence the pixel electrode could not be charged.

Similarly, in the second aspect of the invention, pulses applied to the first and second gate signal lines overlap in time with each other and pulses applied to the third and fourth gate signal lines overlap in time with each other, in which the same pulse is applied to the second and third gate signal lines.

FIGS. 2A and 2B illustrate the above relationship. In FIGS. 2A and 2B, symbols $V_n$ represents a voltage waveform of the gate signal line $X_n$ in FIG. 1A and $D_m$ represents a voltage waveform of the data signal line $Y_m$. As seen from FIGS. 2A and 2B, pulses of $V_n$ and $V_{n+1}$ overlap with each other and pulses of $V_{n+1}$ and $V_{n+2}$ overlap with each other, and a pulse of $D_m$ in an overlapping period is written to the pixel electrode concerned; that is, a pulse $D(Z_{n,m})$ is written to the pixel $Z_{n,m}$ and a pulse $D(Z_{n+1,m})$ is written to the pixel $Z_{n+1,m}$. For comparison, $V_n$ is also shown on $V_{n+2}$ and $D_m$ by a broken line.

FIG. 2A shows a case where selection pulses are sequentially applied to the gate signal lines from the top; in more general terms, a selection pulse is applied to the transistor Tr1 that is connected to the data signal line earlier than to the transistor Tr2 (the transistor Tr1 turns on or off earlier than the transistor Tr2). FIG. 2B shows a case where selection pulses are sequentially applied to the gate signal lines from the bottom; that is, a selection pulse is applied to the transistor Tr2 that is connected to the pixel electrode earlier than to the transistor Tr1 (the transistor Tr2 turns on or off earlier than the transistor Tr1). In the case of FIG. 2B, the data signal $D_m$ may have a waveform of FIG. 2C.

Where a capacitor is formed between the intermediate portion of the transistors Tr1 and Tr2 and a particular gate signal line as shown in FIG. 1C, it should be taken into consideration that the capacitor does not work as an auxiliary capacitor in the operation mode where selection pulses are applied to the gate signal lines from the bottom.

For example, a consideration will be made of the operation mode of FIG. 2B. As for the pixel $Z_{n, m}$, naturally data $D(Z_{n, m})$ is written to this pixel in a state that both transistors Tr1 and Tr2 are on. Then, the transistor Tr2 is turned off while the transistor Tr1 is kept on, and the next data is applied to the data signal line. Naturally no variation occurs in the potential of the pixel capacitor LC because the transistor Tr2 is off. However, the next data is written to the capacitor C. Therefore, the capacitor C does not work as an auxiliary capacitor of the pixel capacitor LC. The same thing applies to the case of FIG. 2C.

In the invention, it is impossible to supplies data to the pixel concerned over the entire period when the transistor Tr1 is on, because the transistor Tr1 is involved in the signal control of the pixel of the above row.

From the above discussion, it will become apparent why it is not preferable to form a capacitor between the intermediate portion of the transistors Tr1 and Tr2 and the gate signal line $X_n$ that controls the transistor Tr1 earlier. In such a circuit arrangement, to avoid a variation in the potential of the pixel electrode due to coupling of the capacitor C and the gate signal line, it is necessary to turn off the transistor Tr2 earlier, that is, to employ the operation mode where selection pulses are applied to the gate signal lines from the bottom. However, in such a case, the transistor Tr1 is kept on even after the transistor Tr2 is turned off, so that a signal not intended for the pixel concerned is written to the capacitor C. Thus, the capacitor C does not properly work as an auxiliary capacitor. Further, when the transistor Tr1 turns off, the potential of the capacitor C drops considerably, i.e., as much as the potential drop on the gate signal line. Forming the capacitor C in the above manner is not preferable also in this respect.

In the operation mode where selection pulses are applied to the gate signal lines from the top, the transistor Tr1 is turned off earlier and at this time point the potential of the capacitor C is equal to that of the pixel capacitor LC. Even if the transistor Tr2 is thereafter turned off, there occurs no problem because there is no current exchange with the data signal line any more.

DETAILED DESCRIPTION OF THE PREFERRED EMBODIMENTS

Embodiment 1

Figure 3A:
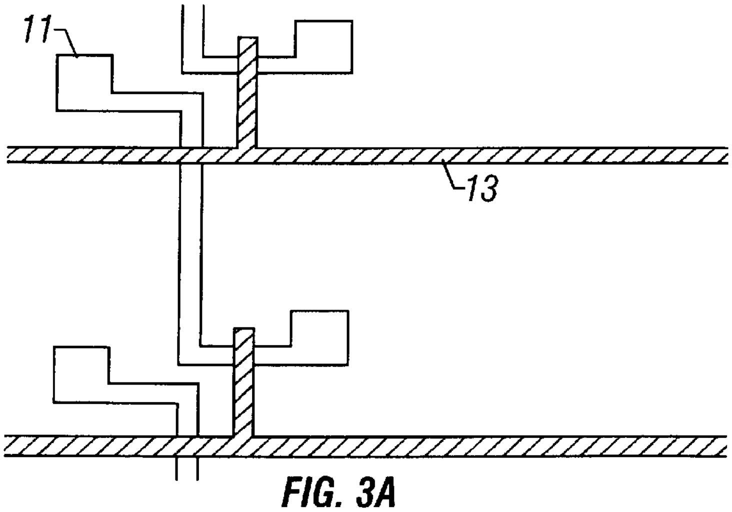
FIGS. 3A–3C are top views showing a manufacturing process of elements of an active matrix circuit according to a first embodiment of the invention.
Figure 3B:
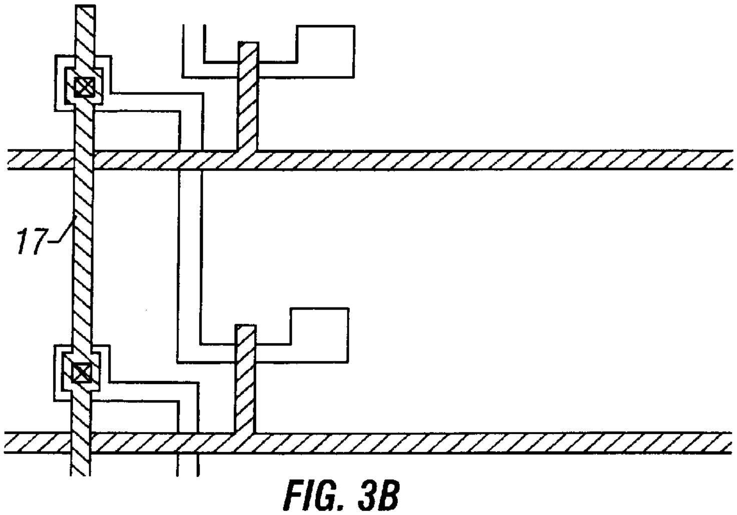
Figure 3C:
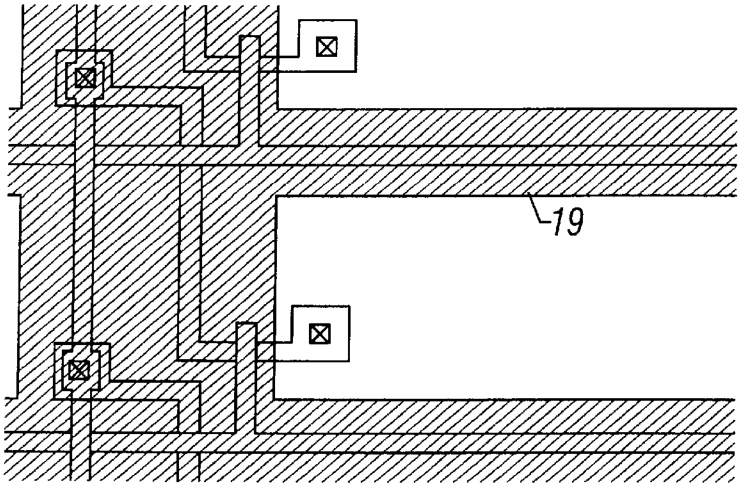

This embodiment will be described with reference to FIGS. 3A–3C, 4A–4D, and 5. FIGS. 3A–3C are top views of an active matrix circuit in order of manufacturing steps. FIGS. 4A–4D are conceptual sectional views showing manufacturing steps of elements, wiring lines, and other parts that constitute the circuit of this embodiment. It is noted that there is no correspondence between FIGS. 3A–3C and FIGS. 4A–4D.

First, an island-like crystalline semiconductor coating 11 is formed on a substrate 10 having an insulating surface by a known method. A gate insulating film 12 is formed to cover the semiconductor coating 11, and a gate signal line 13 is formed thereon (see FIGS. 3A and 4A).

Then, a source 14 and a drain 15 are formed by introducing an n-type or p-type impurity into the semiconductor coating 11 in a self-aligned manner by using the gate signal line 13 as a mask. A first interlayer insulating film 16 is deposited to cover the gate signal line 13 (see FIG. 4B).

Next, after a contact hole is so formed as to reach the source 14, a data signal line 17 is formed. A second interlayer insulating film 18 is then deposited to cover the data signal line 17 (see FIGS. 3B and 4C).

Next, a metal light-shielding layer 19 is formed in an area where incident light should be interrupted (see FIG. 3C).

Subsequently, a third interlayer insulating film 20 is deposited to cover the light-shielding layer 19. A contact hole reaching the drain 15 is formed by etching the first to third interlayer insulating films 16, 18 and 20.

Figure 4A:
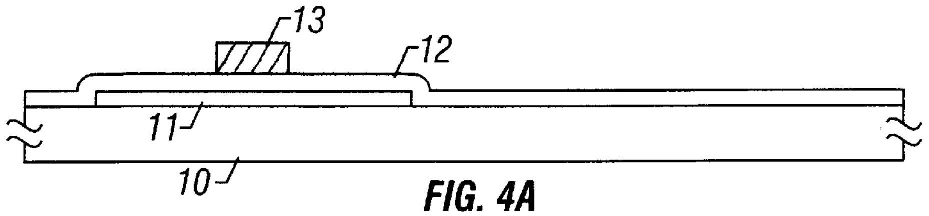
FIGS. 4A–4D are conceptual sectional views showing the manufacturing process of the elements of the active matrix circuit according to the first embodiment.
Figure 4B:
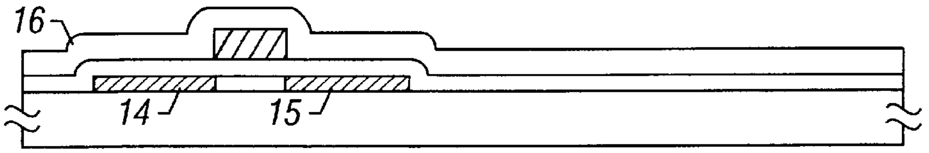
Figure 4C:
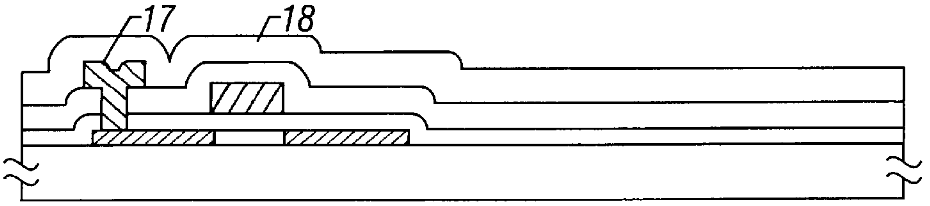
Figure 4D:
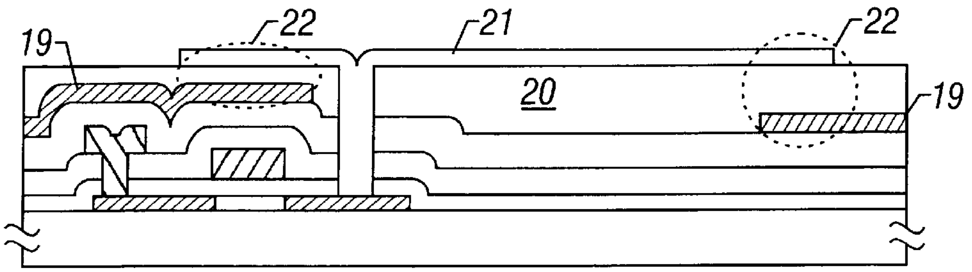

Then, a transparent conductive coating as a pixel electrode 21 is so formed as to overlap with the light-shielding layer 19, whereby a capacitor 22 is formed by the light-shielding layer 19 and the pixel electrode 21 (see FIG. 4D).

Figure 5:
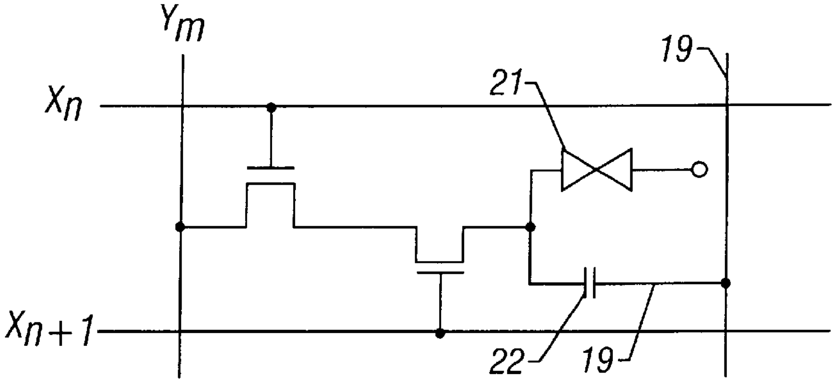
FIG. 5 is a circuit diagram of the active matrix circuit according to the first embodiment.

Thus, a circuit shown in FIG. 5 is obtained. In this embodiment, the capacitor 22 that is formed by the light-shielding layer 19 (supplied with a constant voltage during use) and the pixel electrode 21 is used as an auxiliary capacitor of the pixel capacitor.

As seen from FIGS. 3A–3C, the length of the semiconductor coating 11 is almost determined by the interval between the adjacent gate signal lines 13. As the adjacent gate signal lines 13 are more separated from each other, the semiconductor coating 11 is necessarily elongated and the circuit resistance increases accordingly. Therefore, this embodiment is suitable for a circuit in which the interval between the adjacent gate signal lines 13 is short, that is, the pixel extends along the gate signal lines 13. Conversely, this embodiment is not suitable for a circuit in which the pixel extends along the data signal line 17 because of a long interval between the adjacent gate signal lines 13.

In general, the pixel shape is determined by the shape of the entire screen. This embodiment is effective for devices, such as an EDTV and a HDTV, in which the numbers a and b defining the aspect ratio a:b satisfy a>b, where the aspect ratio means a ratio of the horizontal dimension to the vertical dimension, that is, a ratio of the length of the side along the gate signal lines to the length of the side along the data signal lines. More specifically, this embodiment is suitable for monochrome devices having an aspect ratio of 3:2 or larger, for instance, 16:9. An example of such devices is a panel used in a projection display device.

Embodiment 2

Figure 1A:
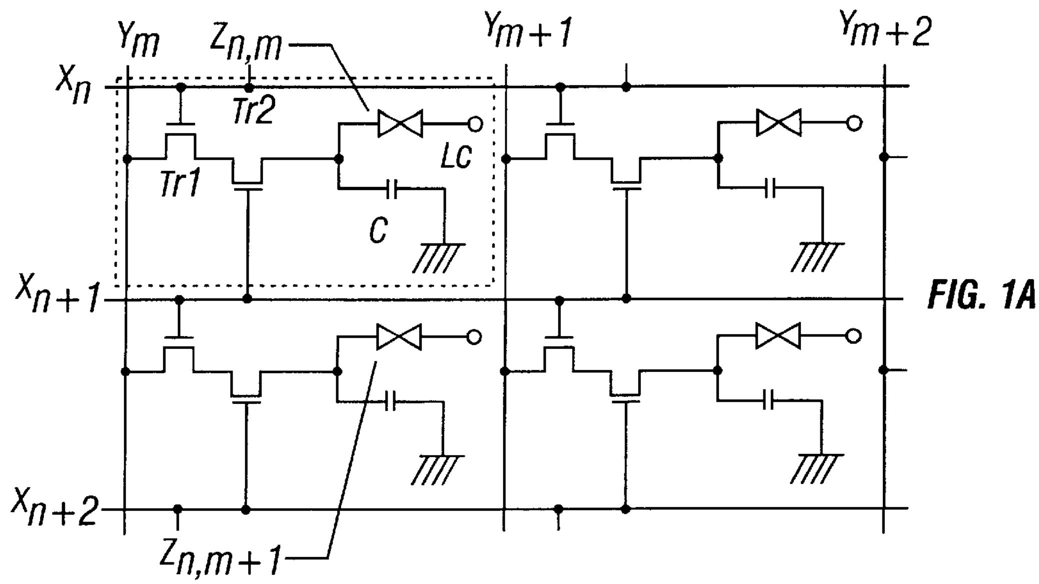
FIGS. 1A–1C show active matrix circuits according to the invention.
Figure 1B:
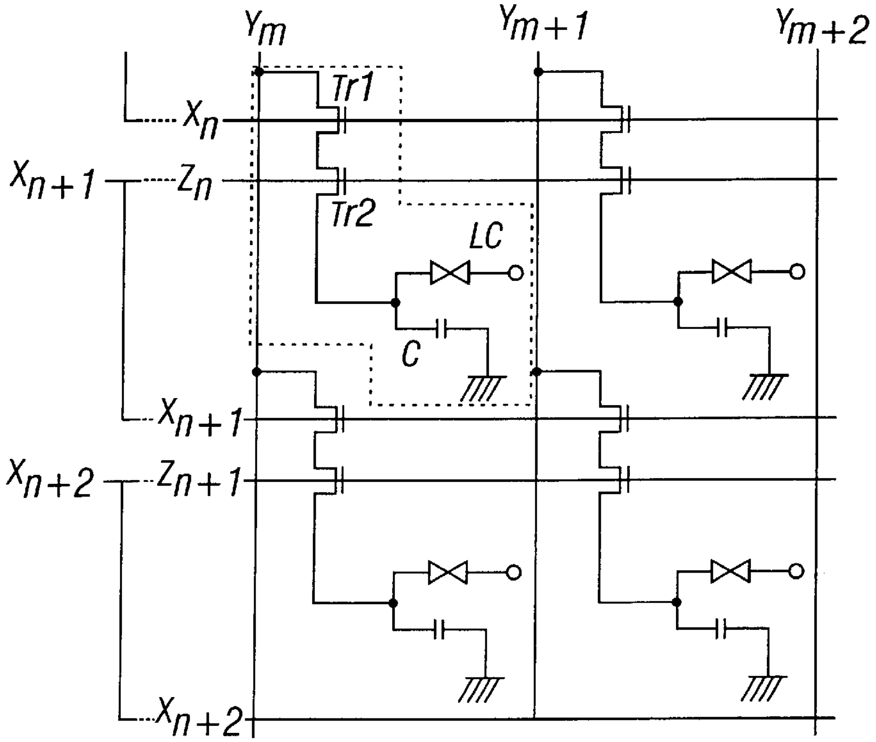
Figure 1C:
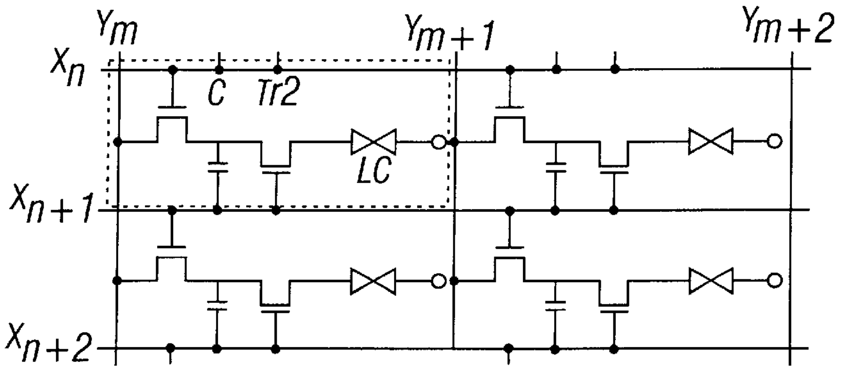
Figure 8A:
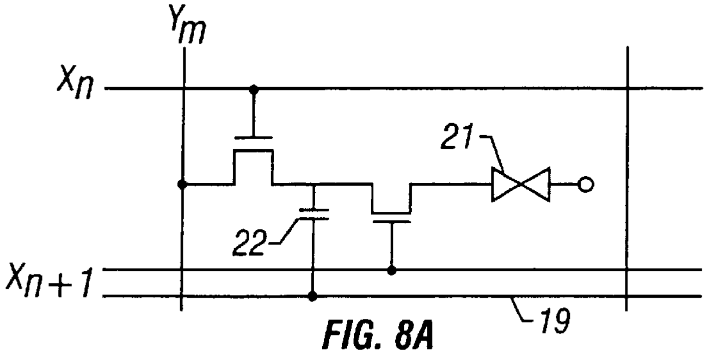
FIG. 8A is a circuit diagram of an active matrix circuit according to a second embodiment of the invention.

This embodiment will be described with reference to a circuit diagram of FIG. 8A. The manufacturing process of this embodiment is substantially the same as that of the first embodiment, and this embodiment uses the same reference symbols as the first embodiment. However, the circuit arrangement of this embodiment has a feature that a capacitor 22 is formed between the first and second transistors as shown in FIG. 8A. The capacitor 22 is formed by using a conductive coating 19 as a black matrix as in the case of the first embodiment rather than by using the gate signal line as shown in FIG. 1C. The capacitor 22 formed in such a manner can be used in the same manner as the auxiliary capacitor C in FIG. 1(C).

Figure 14:
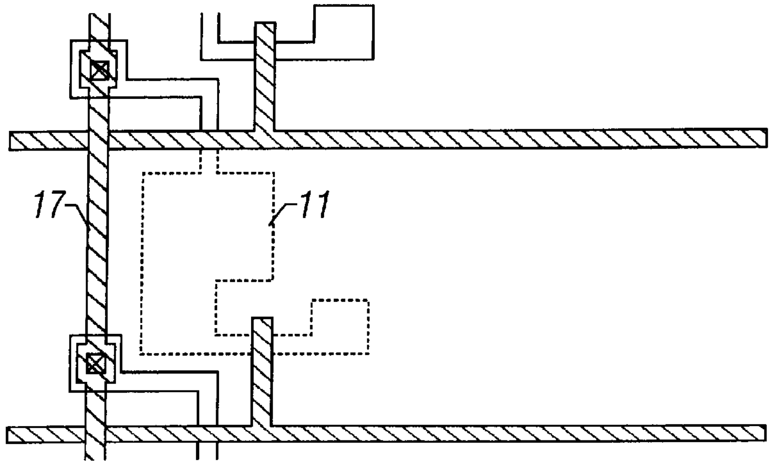
FIG. 14 shows an arrangement of the active matrix circuit according to the second embodiment.
Figure 15A:
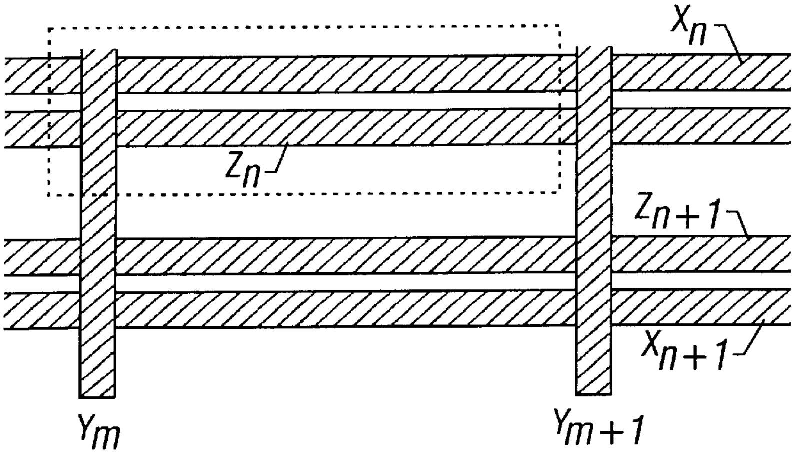
FIGS. 15A–15D illustrate differences between the active matrix circuit of the fourth embodiment and that of the first embodiment.
Figure 15B:
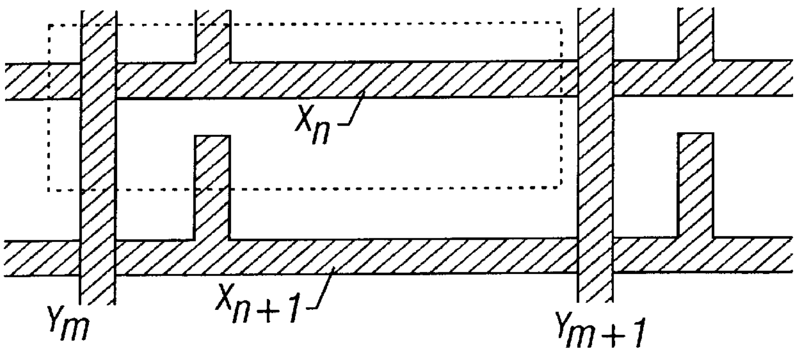
Figure 15C:
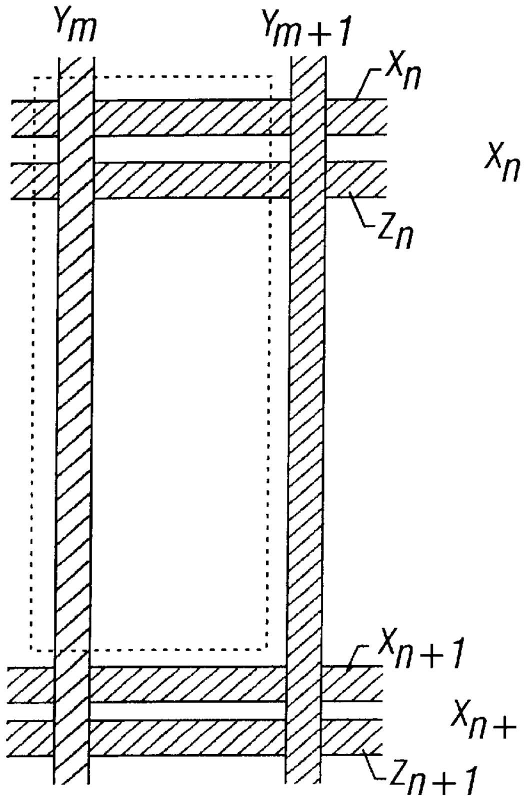
Figure 15D:
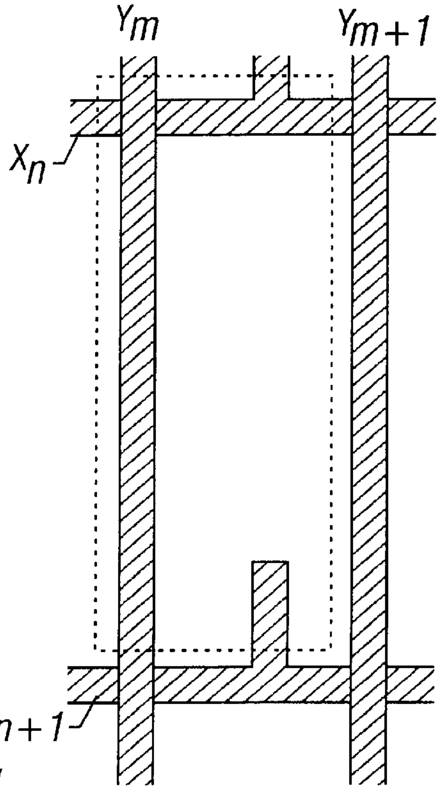

FIG. 14 shows an example of an actual arrangement of wiring lines and other parts of the above circuit. FIG. 14 uses the same reference numerals as in the first embodiment. As shown in FIG. 14, a wide semiconductor coating 11 is formed and a capacitor is formed between the semiconductor coating 11 and a conductive coating (not shown) formed above it with an interlayer insulating film serving as a dielectric.

Embodiment 3

Figure 9A:
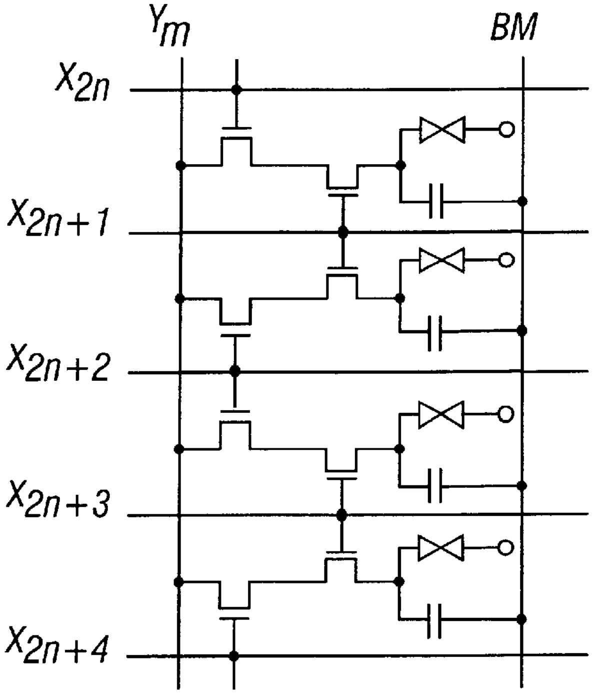
FIGS. 9A and 9B are circuit diagrams of active matrix circuits according to a third embodiment of the invention.
Figure 9B:
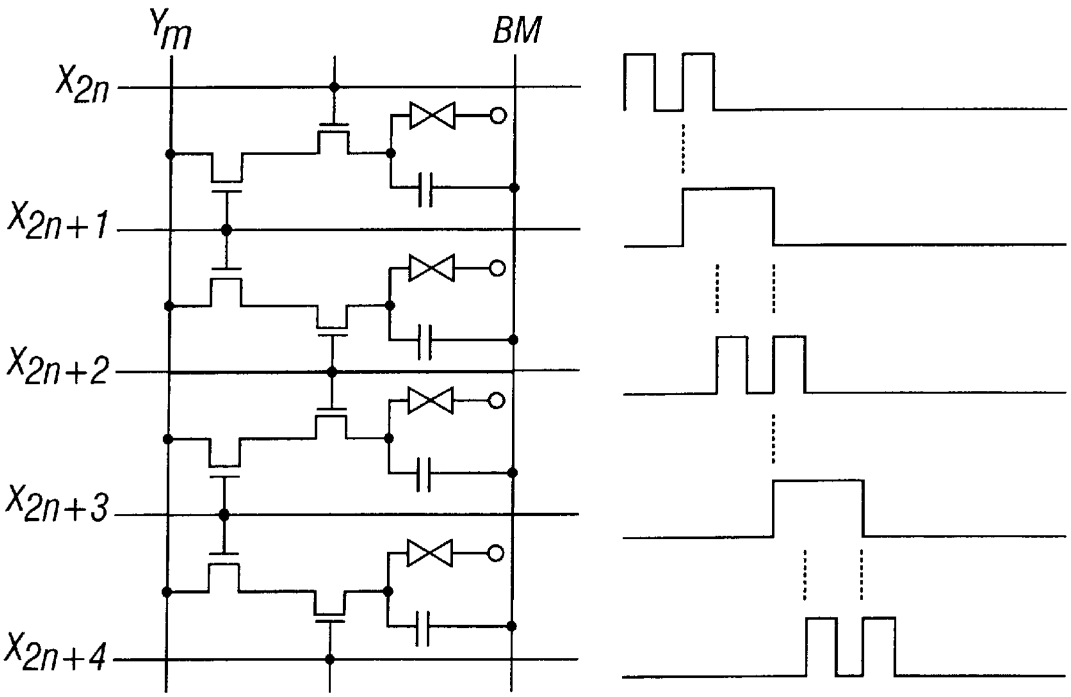

This embodiment will be described by using a circuit diagram of FIGS. 9A and 9B. In this embodiment, a gate signal line for controlling a first transistor (i.e., a transistor connected to a data signal line) is separated from a gate signal line for controlling a second transistor (i.e., a transistor connected to a pixel electrode). In FIG. 9A, gate signal lines $X_{2n}$, $X_{2n+2}$, $X_{2n+4}$, . . . are classified into the former, and gate lines $X_{2n+1}$, $X_{2n+3}$, . . . are classified into the latter. Similarly, in FIG. 9B, gate lines $X_{2n+1}$, $X_{2n+3}$, . . . are classified into the former, and gate signal lines $X_{2n}$, $X_{2n+2}$, $X_{2n+4}$, . . . are classified into the latter. In contrast, in the circuit of FIG. 1A, for instance, every gate signal line controls both first and second transistors.

Figure 2A:
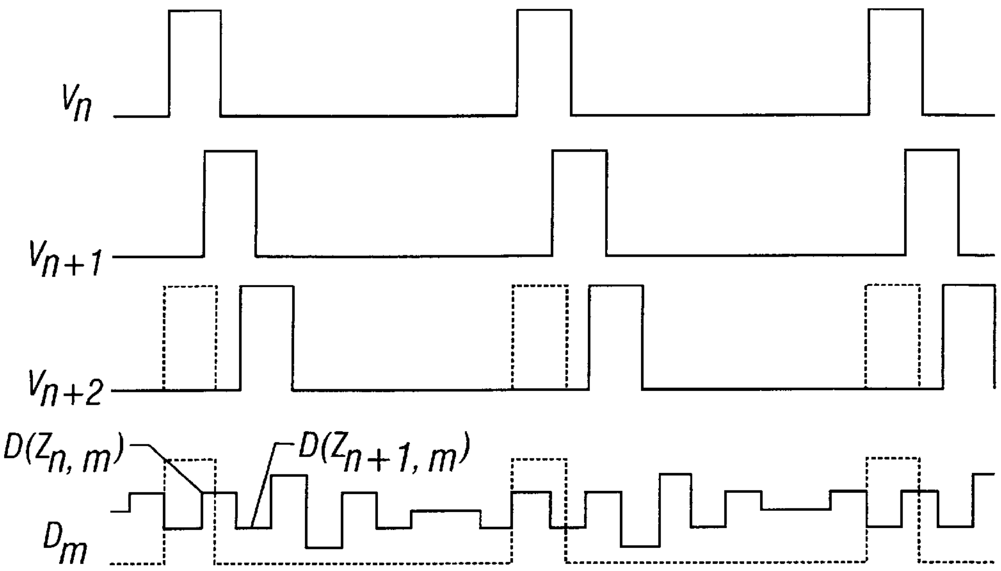
FIGS. 2A–2C show examples of driving of an active matrix circuit according to the invention.
Figure 2B:
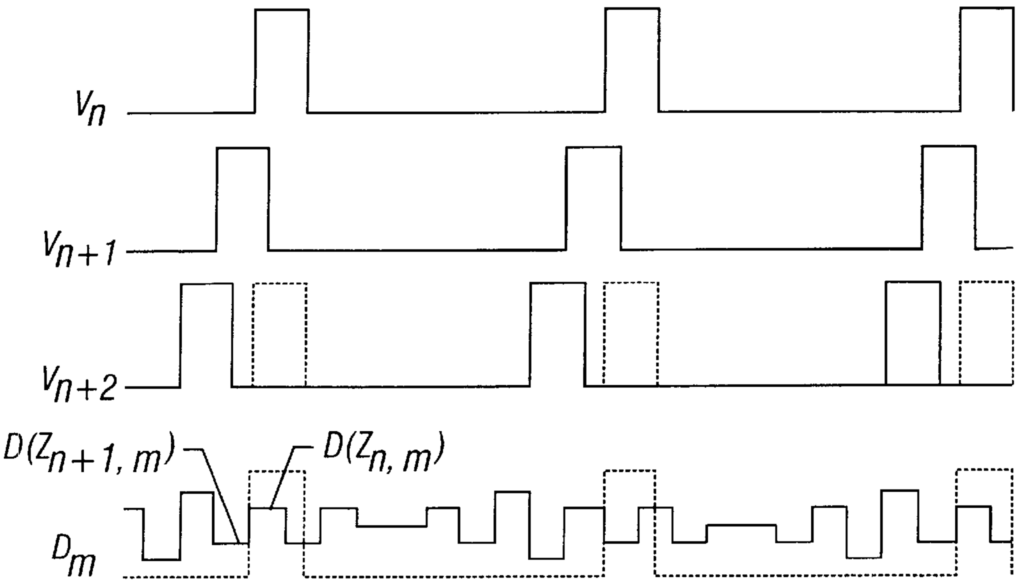
Figure 2C:
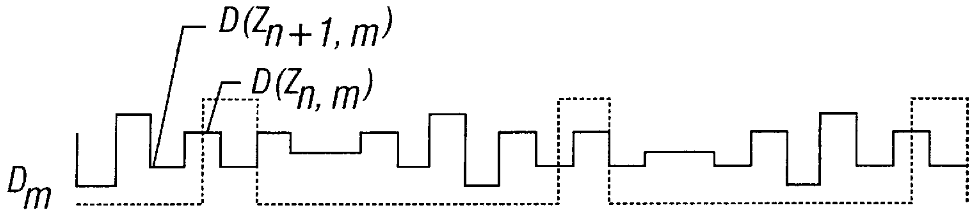

In the above circuits, signals applied to the gate signal lines are different from those shown in FIGS. 2A–2C. As shown in the right-hand part of FIG. 9B, the waveform of a pulse signal applied to each of the gate signal lines $X_{2n+1}$, $X_{2n+3}$, . . . for controlling the first transistors is different from that of a pulse signal applied to each of the gate signal lines $X_{2n}$, $X_{2n+2}$, $X_{2n+4}$ . . . . If the drive signals of FIG. 9B are used, for each pixel the first transistor can be turned off after the second transistor is turned off. If the opposite operation is performed, that is, if the second transistor is turned off after the first transistor is turned off, part of charge stored in the second transistor in an on-state moves to the pixel electrode, causing a variation in the potential of the pixel electrode.

Embodiment 4

Figure 10A:
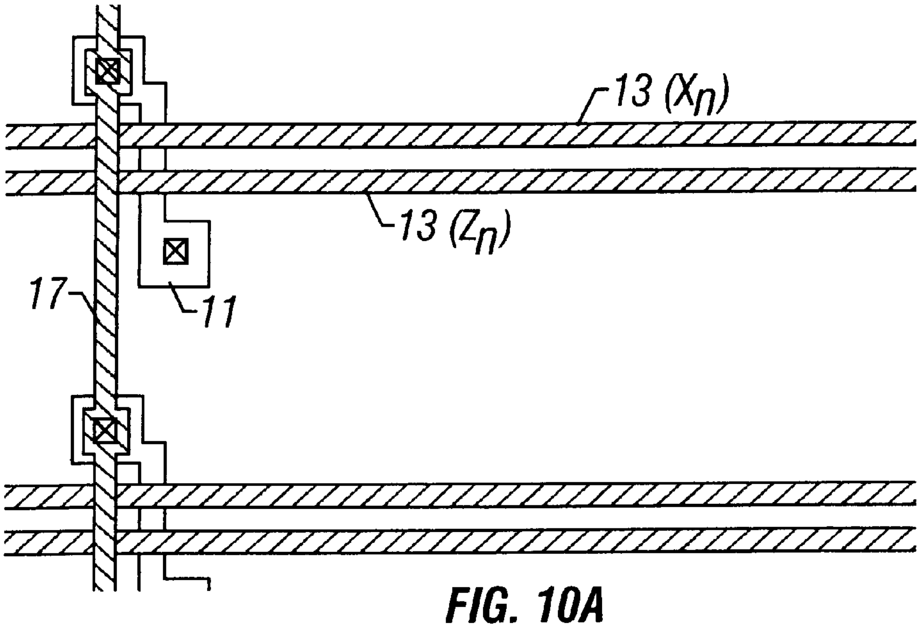
FIGS. 10A and 10B show arrangements of active matrix circuits according to fourth and fifth embodiments of the invention, respectively.

This embodiment will be described with reference to FIG. 10A. This embodiment is directed to an actual arrangement of an active matrix circuit that is shown in a circuit diagram of FIG. 1B. A manufacturing method of the circuit of this embodiment is similar to that of the circuit of the first embodiment, and FIG. 10A uses the same reference symbols as in the first embodiment. FIG. 10A shows an arrangement of a pixel unit at a manufacturing step corresponding to the step of FIG. 3B. This embodiment is different from the first embodiment in that two gate signal lines are needed for each row, resulting in a reduction in open area ratio (aperture ratio). However, in this embodiment, the length of a semiconductor coating 11 is not restricted by the interval between adjacent gate signal lines. Therefore, no problem occurs even if a relationship a<b holds where a and b are numbers defining the aspect ratio a:b, which relationship was undesirable in the first embodiment.

Differences between the circuit of this embodiment (see FIG. 1B) and the circuit of the first embodiment (see FIG. 1A) will be described below with reference to FIGS. 15A–15D. To simplify the drawings, only gate signal lines and data signal lines are shown, that is, semiconductor coatings and other parts are not shown in FIGS. 15A–15D.

First, a consideration will be made of a case where each pixel assumes a rectangle that is long in the horizontal direction (aspect ratio: 3:1). Where this embodiment is employed in such a case (see FIG. 15A), the proportion of the area occupied by wiring lines (gate signal lines and a data signal line) to the area of the pixel unit (indicated by a broken-line rectangle in FIG. 15A) is larger than that in the first embodiment (see FIG. 15B). Therefore, it is not preferable to apply this embodiment to pixels that assume a horizontally long rectangle.

Next, a consideration will be made of a case where each pixel assumes a rectangle that is long in the vertical direction. Where this embodiment is employed in such a case (see FIG. 15C), the proportion of the area occupied by the wiring lines to the area of the pixel unit (indicated by a broken-line rectangle in FIG. 15C) is not much different from that in the first embodiment (see FIG. 15D). The first embodiment is even disadvantageous in that the semiconductor coating (not shown) is so long that its resistance may cause a problem. In addition, the semiconductor coating occupies a large proportion of the pixel unit. Thus, it is preferable to apply this embodiment to pixels that assume a vertically long rectangle.

Vertically long pixels as mentioned above are used in a color panel having three pixels corresponding to the three primary colors per pixel unit which panel is a component of a display device having an ordinary aspect ratio 4:3. In this type of panel, although each pixel unit is approximately square, a pixel of each color assumes a vertically long rectangle having an aspect ratio 1:3 because the pixel unit is equally divided into three parts.

Embodiment 5

Figure 10B:
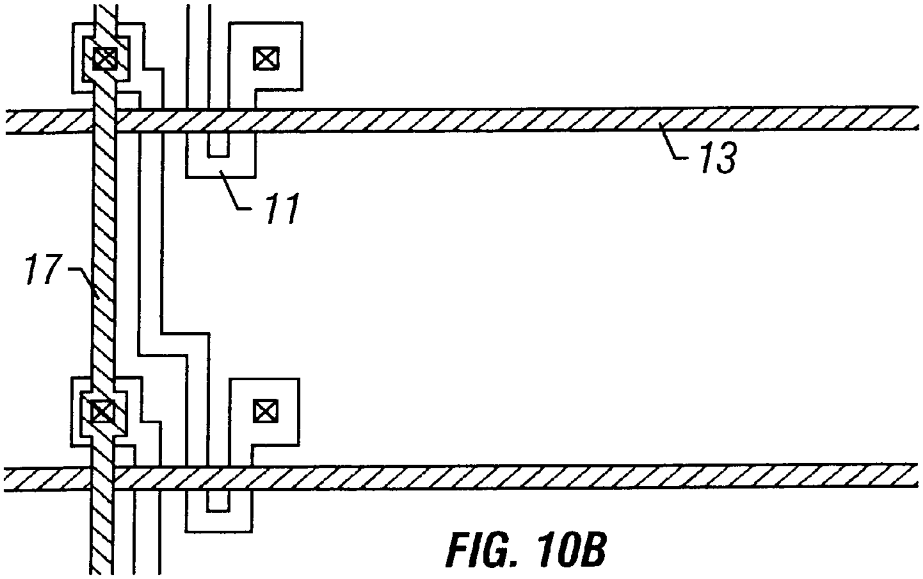
Figure 10C:
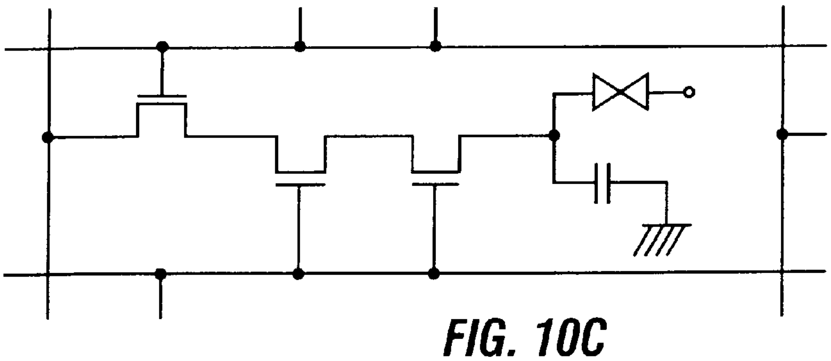
FIG. 10C is a circuit diagram of the active matrix circuit according to the fifth embodiment.

This embodiment will be described with reference to FIGS. 10B and 10C. This embodiment is a further advanced version of the active matrix circuit of FIG. 1A. A manufacturing method of the circuit of this embodiment is similar to that of the circuit of the first embodiment, and FIG. 10B uses the same reference symbols as in the first embodiment. FIG. 10B shows an arrangement of a pixel unit at a manufacturing step corresponding to the step of FIG. 3B. FIG. 10C is a circuit diagram of a pixel unit. As in the case of the first embodiment, an auxiliary capacitor is formed by using parts of a conductive black matrix coating and a pixel electrode.

In this embodiment, the leak current can further be reduced by employing a multigate transistor in which a gate signal line $X_{n+1}$ traverses a semiconductor coating at least two times. The circuit of FIG. 10B is of a case where a multigate transistor is applied to the circuit of FIG. 1A. It is apparent that a multigate transistor can be applied to the circuit (circuit arrangement) of FIG. 1B (or FIG. 10A) in a similar manner.

Embodiment 6

Figure 11A:
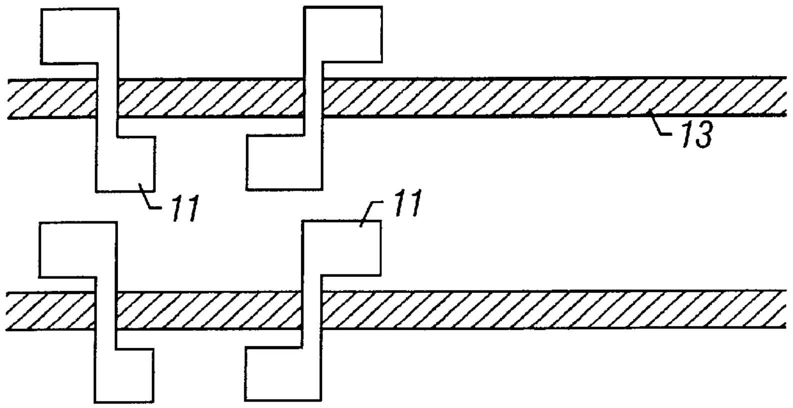
FIGS. 11A–11C are top views showing a manufacturing process of elements of an active matrix circuit according to a sixth embodiment of the invention.
Figure 11B:
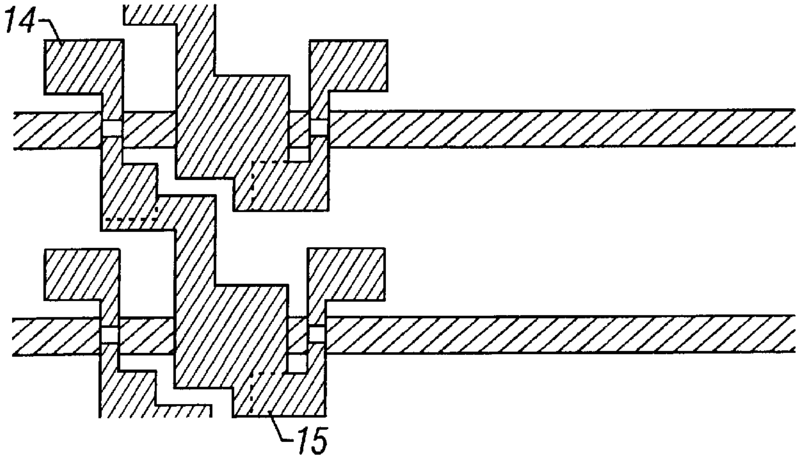
Figure 11C:
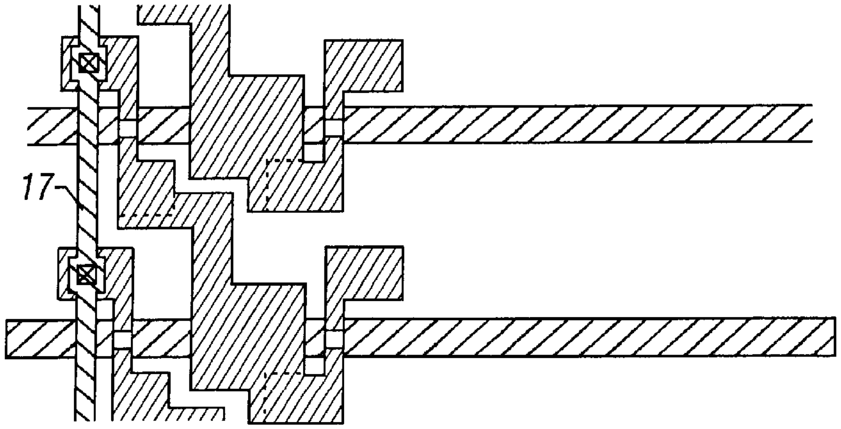
Figure 12A:
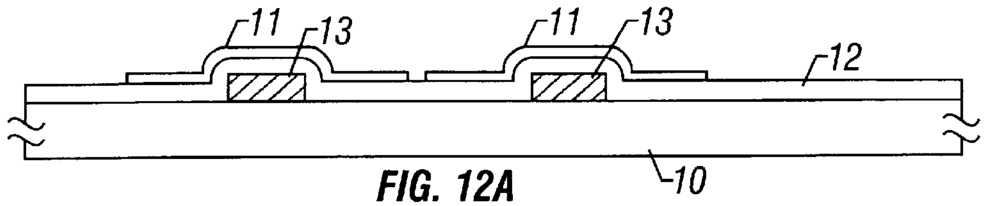
FIGS. 12A–12C are conceptual sectional views showing the manufacturing process of the elements of the active matrix circuit according to the sixth embodiment.
Figure 12B:
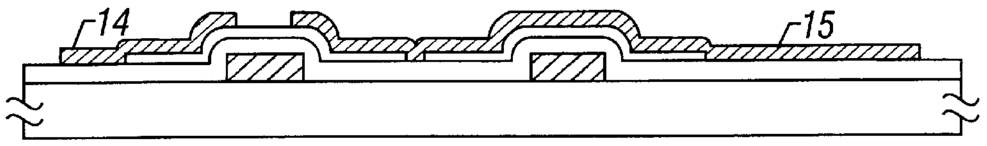
Figure 12C:
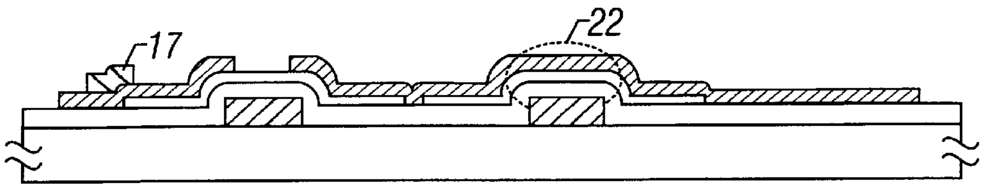

FIGS. 11A–11C and 12A–12C show this embodiment. This embodiment is directed to an actual arrangement of the active matrix circuit shown in the circuit diagram of FIG. 1C. FIGS. 11A–11C are top views showing manufacturing steps of the active matrix circuit of this embodiment. FIGS. 12A–12C are conceptual sectional views showing manufacturing steps of elements, wiring lines, and other parts that constitute the circuit of this embodiment. The sectional views of FIGS. 12A–12C do not correspond to any particular portions shown in FIGS. 11A–11C.

First, gate signal lines 13 are formed on a substrate 10 having an insulating surface, and a gate insulating film 12 is formed to cover the gate signal lines 13. Island-like amorphous semiconductor coatings 11 are then formed by a known method (see FIGS. 11A and 12A).

Subsequently, n-type or p-type semiconductor coatings 14 (source) and 15 (drain) are formed by a known semiconductor coating forming method. In this step, in the area where a switching element is to be formed (the left-hand side of FIG. 12B), the semiconductor coatings 14 and 15 are so formed as to be divided by the gate signal line 13. On the other hand, in the area where an auxiliary capacitor 22 is to be formed, the semiconductor coatings 14 and 15 are so formed as to traverse the gate signal line 13 (see FIGS. 11B and 12B).

Next, a data signal line 17 is formed by a known metal wiring forming technique. Thus, the main part of the circuit is formed. The circuit is then completed by forming a pixel electrode and a protection film (see FIGS. 11C and 12C).

This embodiment is advantageous in that there is no need for forming a plurality of interlayer insulating films as in the case of the first embodiment, because the auxiliary capacitor 22 is formed by the gate signal line 13 and the semiconductor coating 15.

Embodiment 7

Figure 8B:
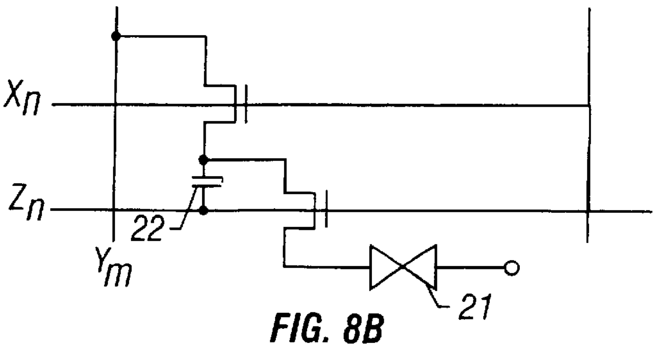
FIG. 8B is a circuit diagram of an active matrix circuit according to a seventh embodiment of the invention.
Figure 13:
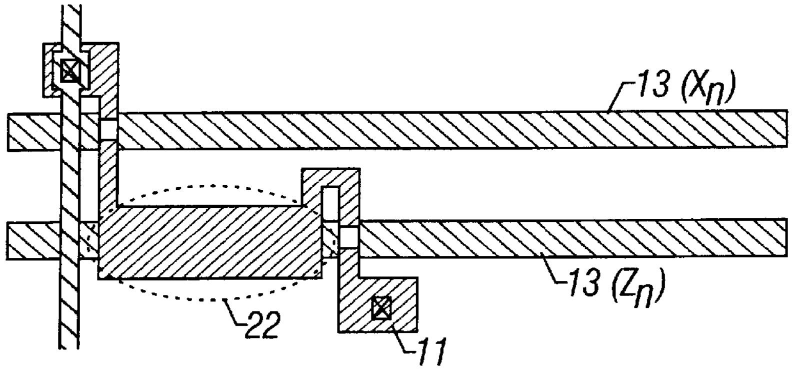
FIG. 13 shows an arrangement of the active matrix circuit according to the seventh embodiment.

FIGS. 8B and 13 show this embodiment. A manufacturing method of an active matrix circuit of this embodiment is similar to that of the circuit of the sixth embodiment, and this uses the same reference symbols as in the sixth embodiment. As shown in a circuit diagram of FIG. 8B, this embodiment is directed to an example in which an auxiliary capacitor is formed in the circuit of FIG. 1B by using a gate signal line in the manner shown in FIG. 1C. An actual arrangement is shown in FIG. 13. That is, an auxiliary capacitor 22 is formed by overlapping a semiconductor coating 11 with a gate signal line 13 ($Z_n$).

Figure 6:
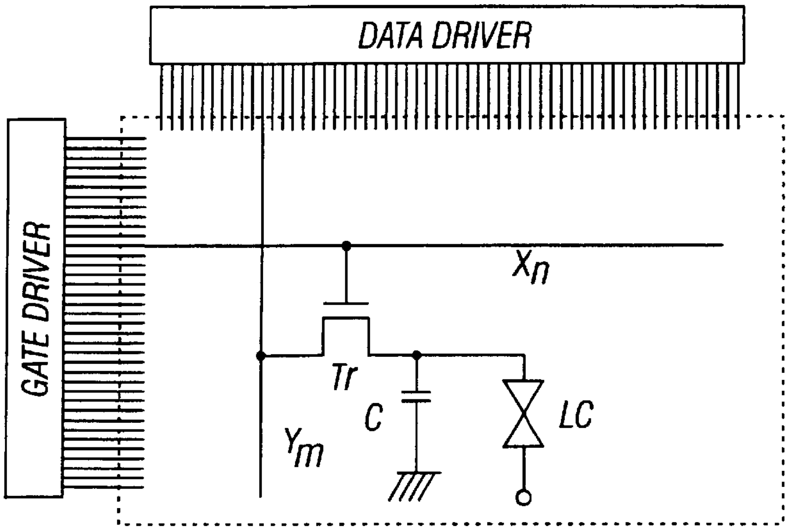
FIG. 6 (PRIOR ART)
FIGS. 6 and 7 are circuit diagrams of a conventional active matrix circuit.
Figure 7:
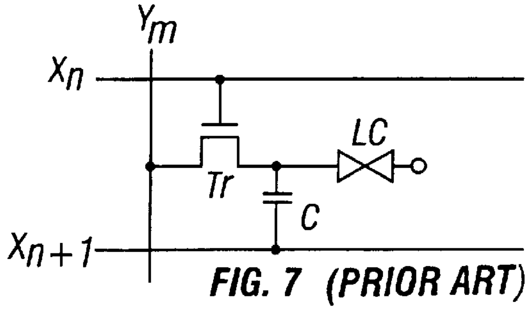
FIG. 7 (PRIOR ART)

As described above, the voltage drop in a liquid crystal cell can be reduced by connecting a plurality of thin-film transistors and a proper capacitor to it. The invention is effectively used for applications where high-quality image display is required. Where very fine gradation performance of 256 or more gradation levels is required, the voltage drop in a liquid crystal cell due to discharging needs to be suppressed to 1% or less in one frame. The conventional scheme (see FIG. 6) is not suitable for this purpose.

In particular, the invention is suitably applied to active matrix liquid crystal display devices in which thin-film transistors using a crystalline silicon semiconductor are arranged which devices are suitable for, for instance, display with a matrix having a large number of rows. In general, it is not appropriate to use thin-film transistors using an amorphous silicon semiconductor for a matrix having a large number of rows which allows only a short selection time per row. On the other hand, thin-film transistors using a crystalline silicon semiconductor have a problem of large off-current. Therefore, the invention, which can reduce the off-current, should greatly contribute to this technical field.

Although in the above embodiments the manufacturing processes were not described in detail, it is apparent that there occur no discrepancy in applying known various methods of forming elements and wiring lines to the invention because the invention relates to the arrangement and design of a circuit. For example, both types of transistor having a lightly doped drain (LDD) and transistor having an offset-gate structure (for instance, see Japanese Unexamined Patent Publication Nos. Hei. 5-114724 and hei. 5-267667) can be used in practicing the invention, without causing any problem.

What is claimed is:

1. An active matrix circuit comprising:

a gate signal line provided over a substrate and comprising a lateral pattern and a branch pattern, said branch pattern branching out from said lateral pattern;

a first semiconductor island provided over said substrate;

a second semiconductor island provided over said substrate and provided adjacent to said first semiconductor island;

wherein said branch pattern of said gate signal line overlaps with said first semiconductor island, and said lateral pattern of said gate signal line overlaps with said second semiconductor island.

2. The circuit of claim 1 wherein said circuit is provided in HDTV.

3. An active matrix circuit comprising:

a gate signal line provided over a substrate and comprising a lateral pattern and a branch pattern, said branch pattern branching out from said lateral pattern;

a first thin film transistor comprising a first semiconductor island provided over said substrate;

a second thin film transistor comprising a second semiconductor island provided over said substrate and provided adjacent to said first semiconductor island;

wherein said branch pattern of said gate signal line overlaps with a channel forming region of said first semiconductor island, and said lateral pattern of said gate signal line overlaps with a channel forming region of said second semiconductor island, so that a selection signal is supplied to said first and second thin film transistors through said gate signal line.

4. The circuit of claim 3 wherein said first and second thin film transistors have respective lightly doped drains.

5. The circuit of claim 3 wherein said first and second thin film transistors have respective offset-gate structures.

6. The circuit of claim 3 wherein said circuit is provided in HDTV.

7. An active matrix circuit comprising:

a first gate signal line provided over a substrate;

a second gate signal line provided over said substrate and adjacent to said first gate signal line; and a semiconductor island provided over said substrate and having a channel forming region of a first thin film transistor and a channel forming region of a second thin film transistor, wherein said first gate signal line overlaps with said semiconductor island at said channel forming region of said first thin film transistor, wherein said second gate signal line overlaps with said semiconductor island at said channel forming region of said second thin film transistor, and wherein said second gate signal line overlaps with a part of said semiconductor island provided between said channel forming region of said first thin film transistor and said channel forming region of said second thin film transistor, said part being doped with the same dopant as source and drain regions of at least one of said first and second thin film transistors to constitute a capacitor comprising said part and said second gate signal line and a dielectric provided therebetween.

8. The circuit of claim 7 wherein said first and second thin film transistors have respective lightly doped drains.

9. The circuit of claim 7 wherein said first and second thin film transistors have respective offset-gate structures.

10. The circuit of claim 7 wherein said circuit is provided in HDTV.

11. An active matrix circuit comprising:

pixel electrodes arranged in matrix form over a substrate;

selection signal lines provided over said substrate, each of said selection signal lines comprising a lateral pattern and a branch pattern branching out from said lateral pattern;

data signal lines arranged so as to cross said selection signal lines;

switching elements connected to the respective pixel electrodes and the corresponding data signal lines, the switching elements comprising;

a first switching element controlled by a first selection signal line and a second selection signal line adjacent to said first selection signal line, said first switching element comprising a first semiconductor island overlapping with the lateral pattern of said first selection signal line and the branch pattern of said second selection signal line; and a second switching element provided adjacent to said first switching element and connected to the same data signal line as said first switching element, said second switching element being controlled by said second selection signal line and a third selection signal line adjacent to said second selection signal line, said second switching element comprising a second semiconductor island overlapping with the lateral pattern of said second selection signal line and the branch pattern of said third selection signal line.

12. The circuit of claim 11 wherein said circuit is provided in HDTV.

13. An electro-optical device comprising:

a gate signal line provided over a substrate and comprising a lateral pattern and a branch pattern, said branch pattern branching out from said lateral pattern;

a first semiconductor island provided over said substrate in an active matrix region;

a second semiconductor island provided over said substrate in said active matrix region and provided adjacent to said first semiconductor island;

wherein said branch pattern of said gate signal line overlaps with said first semiconductor island, and said lateral pattern of said gate signal line overlaps with said second semiconductor island.

14. The device of claim 13 wherein said device is HDTV.

15. An electro-optical device comprising:

a gate signal line provided over a substrate and comprising a lateral pattern and a branch pattern, said branch pattern branching out from said lateral pattern;

a first thin film transistor comprising a first semiconductor island provided over said substrate in an active matrix region;

a second thin film transistor comprising a second semiconductor island provided over said substrate in said active matrix region and provided adjacent to said first semiconductor island;

wherein said branch pattern of said gate signal line overlaps with a channel forming region of said first semiconductor island, and said lateral pattern of said gate signal line overlaps with a channel forming region of said second semiconductor island, so that a selection signal is supplied to said first and second thin film transistors through said gate signal line.

16. The device of claim 15 wherein said first and second thin film transistors have respective lightly doped drains.

17. The device of claim 15 wherein said first and second thin film transistors have respective offset-gate structures.

18. The device of claim 15 wherein said device is HDTV.

19. An electro-optical device comprising:

a first gate signal line provided over a substrate;

a second gate signal line provided over said substrate and adjacent to said first gate signal line; and a semiconductor island provided over said substrate in an active matrix region and having a channel forming region of a first thin film transistor and a channel forming region of a second thin film transistor, wherein said first gate signal line overlaps with said semiconductor island at said channel forming region of said first thin film transistor, wherein said second gate signal line overlaps with said semiconductor island at said channel forming region of said second thin film transistor, and wherein said second gate signal line overlaps with a part of said semiconductor island provided between said channel forming region of said first thin film transistor and said channel forming region of said second thin film transistor, said part being doped with the same dopant as source and drain regions of at least one of said first and second thin film transistors to constitute a capacitor comprising said part and said second gate signal line and a dielectric provided therebetween.

20. The device of claim 19 wherein said first and second thin film transistors have respective lightly doped drains.

21. The device of claim 19 wherein said first and second thin film transistors have respective offset-gate structures.

22. The device of claim 19 wherein said device is HDTV.

23. An electro-optical device comprising:

pixel electrodes arranged in matrix form over a substrate;

selection signal lines provided over said substrate, each of said selection signal lines comprising a lateral pattern and a branch pattern branching out from said lateral pattern;

data signal lines arranged so as to cross said selection signal lines;

switching elements connected to the respective pixel electrodes and the corresponding data signal lines, the switching elements comprising;

a first switching element controlled by a first selection signal line and a second selection signal line adjacent to said first selection signal line, said first switching element comprising a first semiconductor island overlapping with the lateral pattern of said first selection signal line and the branch pattern of said second selection signal line; and a second switching element provided adjacent to said first switching element and connected to the same data signal line as said first switching element, said second switching element being controlled by said second selection signal line and a third selection signal line adjacent to said second selection signal line, said second switching element comprising a second semiconductor island overlapping with the lateral pattern of said second selection signal line and the branch pattern of said third selection signal line.

24. The device of claim 23 wherein said device is HDTV.

25. A projection device comprising:

a gate signal line provided over a substrate and comprising a lateral pattern and a branch pattern, said branch pattern branching out from said lateral pattern;

a first semiconductor island provided over said substrate in an active matrix region;

a second semiconductor island provided over said substrate in said active matrix region and provided adjacent to said first semiconductor island;

wherein said branch pattern of said gate signal line overlaps with said first semiconductor island, and said lateral pattern of said gate signal line overlaps with said second semiconductor island.

26. The device of claim 25 wherein said device is HDTV.

27. A projection device comprising:

a gate signal line provided over a substrate and comprising a lateral pattern and a branch pattern, said branch pattern branching out from said lateral pattern;

a first thin film transistor comprising a first semiconductor island provided over said substrate in an active matrix region;

a second thin film transistor comprising a second semiconductor island provided over said substrate in said active matrix region and provided adjacent to said first semiconductor island;

wherein said branch pattern of said gate signal line overlaps with a channel forming region of said first semiconductor island, and said lateral pattern of said gate signal line overlaps with a channel forming region of said second semiconductor island, so that a selection signal is supplied to said first and second thin film transistors through said gate signal line.

28. The device of claim 27 wherein said first and second thin film transistors have respective lightly doped drains.

29. The device of claim 27 wherein said first and second thin film transistors have respective offset-gate structures.

30. The device, of claim 27 wherein said device is HDTV.

31. A projection device comprising:

a first gate signal line provided over a substrate;

a second gate signal line provided over said substrate and adjacent to said first gate signal line; and a semiconductor island provided over said substrate in an active matrix region and having a channel forming region of a first thin film transistor and a channel forming region of a second thin film transistor, wherein said first gate signal line overlaps with said semiconductor island at said channel forming region of said first thin film transistor, wherein said second gate signal line overlaps with said semiconductor island at said channel forming region of said second thin film transistor, and wherein said second gate signal line overlaps with a part of said semiconductor island provided between said channel forming region of said first thin film transistor and said channel forming region of said second thin film transistor, said part being doped with the same dopant as source and drain regions of at least one of said first and second thin film transistors to constitute a capacitor comprising said part and said second gate signal line and a dielectric provided therebetween.

32. The device of claim 31 wherein said first and second thin film transistors have respective lightly doped drains.

33. The device of claim 31 wherein said first and second thin film transistors have respective offset-gate structures.

34. The device of claim 31 wherein said device is HDTV.

35. A projection device comprising:

pixel electrodes arranged in matrix form over a substrate;

selection signal lines provided over said substrate, each of said selection signal lines comprising a lateral pattern and a branch pattern branching out from said lateral pattern;

data signal lines arranged so as to cross said selection signal lines;

switching elements connected to the respective pixel electrodes and the corresponding data signal lines, the switching elements comprising;

a first switching element controlled by a first selection signal line and a second selection signal line adjacent to said first selection signal line, said first switching element comprising a first semiconductor island overlapping with the lateral pattern of said first selection signal line and the branch pattern of said second selection signal line; and a second switching element provided adjacent to said first switching element and connected to the same data signal line as said first switching element, said second switching element being controlled by said second selection signal line and a third selection signal line adjacent to said second selection signal line, said second switching element comprising a second semiconductor island overlapping with the lateral pattern of said second selection signal line and the branch pattern of said third selection signal line.

36. The device of claim 35 wherein said device is HDTV.

* * * * *